United States Patent [19]
Goto

[11] Patent Number: 5,444,724
[45] Date of Patent: Aug. 22, 1995

[54] TUNABLE WAVELENGTH LIGHT SOURCE INCORPORATED OPTICAL FILTER USING INTERFEROMETER INTO EXTERNAL CAVITY

[75] Inventor: Hiroshi Goto, Isehara, Japan

[73] Assignee: Anritsu Corporation, Tokyo, Japan

[21] Appl. No.: 296,358

[22] Filed: Aug. 25, 1994

[30] Foreign Application Priority Data

Aug. 26, 1993 [JP] Japan ................... 5-232231

[51] Int. Cl.$^6$ .................................. H01S 3/10
[52] U.S. Cl. .......................... 372/20; 372/34; 372/29
[58] Field of Search ............ 372/20, 29, 34; 385/27

[56] References Cited

U.S. PATENT DOCUMENTS

| | | | |
|---|---|---|---|
| 4,291,281 | 9/1981 | Pinard et al. | |
| 4,794,617 | 12/1988 | Boeck | |
| 4,818,064 | 4/1989 | Youngquist et al. | 385/27 |
| 4,955,026 | 9/1990 | Hill et al. | 372/20 |
| 5,285,059 | 2/1994 | Nakata et al. | 372/29 |

FOREIGN PATENT DOCUMENTS

| | | |
|---|---|---|
| 0216212 | 4/1987 | European Pat. Off. |
| 2402320 | 3/1979 | France |
| 61-80109 | 4/1986 | Japan |
| 2271463 | 4/1994 | United Kingdom |

OTHER PUBLICATIONS

Hewlett–Packard Journal, vol. 44, No. 1, Feb., 1993, Palo Alto, U.S., pp. 20–27, E. Muller et al., "External–Cavity Laser Design and Wavelength Calibration".

Applied Physics Letters, vol. 40, No. 4, Feb. 15, 1982, New York, U.S., pp. 302–304, S. J. Petuchowski et al., "Phase Sensitivity and Linewidth Narrowing in a Fox–Smith Configured Semiconductor Laser".

Patent Abstracts of Japan, vol. 13, No. 207 (E–758) May 16, 1989 & JP–A–01 024 482 (Kokusai Denshi Denwa), Jan. 26, 1989.

P. Zorabedian et al.; "Interference–Filter–Tuned, Alignment–Stabilized, Semiconductor External–Cavity Laser"; Oct. 1988; pp. 826–828; Optics Letters, vol. 13, No. 10.

E. Muller et al.; "External–Cavity Laser Design & Wavelength Calibration"; Feb. 1993; pp. 20–27; Hewlett–Packard Journal.

*Primary Examiner*—Léon Scott, Jr.
*Attorney, Agent, or Firm*—Frishauf, Holtz, Goodman, Langer & Chick

[57] ABSTRACT

In an external-cavity tunable wavelength light source using a semiconductor laser (LD), when an interferometer serving as an optical filter is constituted by part of an external cavity, an external-cavity longitudinal mode can be selected with good reproducibility, and a side mode suppression ratio can be increased. A light beam emitted from an AR-coated facet of an LD is converted into a collimated beam by a lens, and the collimated beam is incident on a Mach-Zehnder (MZ) interferometer serving as an optical filter. An interference light beam emerges from the MZ interferometer toward a diffraction grating. Only a light component having a specific wavelength and selected by spectrally dispersing the interference light beam reversely travels in the same optical path as that of the interference light beam and is returned to the LD. In this manner, a cavity is formed between the LD and the diffraction grating, and a laser beam having a wavelength determined by three relationships between an external-cavity longitudinal mode, a cavity loss caused by the diffraction grating, and the output characteristics of an interference light beam from the MZ interferometer is oscillated.

41 Claims, 8 Drawing Sheets

CAVITY LOSS CAUSED BY DIFFRACTION GRATING

FIG. 5A

OUTPUT OF INTERFERENCE LIGHT BEAM

FIG. 5B

INTERFERENCE LIGHT BEAM

FIG. 5C

EXTERNAL-CAVITY LONGITUDINAL MODE

TUNABLE WAVELENGTH LIGHT SOURCE INCORPORATED OPTICAL FILTER USING INTERFEROMETER INTO EXTERNAL CAVITY

BACKGROUND OF THE INVENTION

1. Field of the Invention

The present invention generally relates to a tunable wavelength light source, particularly, to an external-cavity tunable waveguide light source using a semiconductor laser, and more particularly, to a tunable wavelength optical source in which an optical filter using an interferometer serves as part of an external cavity to tune the oscillation wavelength of a laser beam at good reproducibility and a high resolving power, thereby improving various characteristics such as a side mode suppression ratio and a spectral line width.

2. Description of the Related Art

As a typical conventional external-cavity tunable wavelength light source using a semiconductor laser and used in the above field, a tunable waveguide light source in which a wavelength is selected by an external diffraction grating is known.

Figures 9, 10:
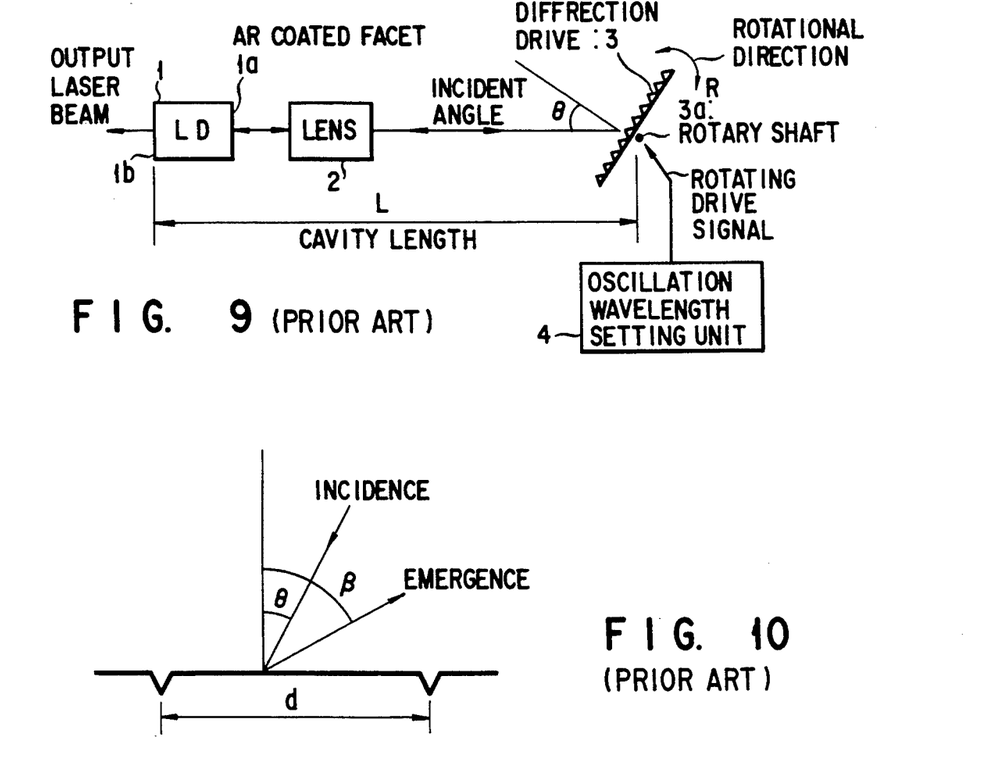
FIG. 9 is a view showing the arrangement of a conventional external-cavity tunable wavelength light source.
FIG. 10 is a view for explaining the operation of a diffraction grating.

FIG. 9 shows the arrangement of a conventional external-cavity tunable waveguide light source.

A light beam emerging from an AR-coated (AR: Anti-Reflection) facet 1a of a semiconductor laser (LD) 1 is converted into a collimated beam by a lens 2, and the parallel beam is incident on a diffraction grating 3. The collimated beam is spectrally dispersed by the diffraction grating 3, and only a light component having a specific wavelength (to be described later) is returned to the LD 1. In this manner, a cavity is formed between a facet 1b of the LD 1 which is not AR-coated and the diffraction grating 3, thereby oscillating a laser beam having a wavelength determined by a cavity length L. An output laser beam is emitted from the facet 1b of the LD 1 which is not AR-coated.

Note that an oscillation wavelength setting unit 4 outputs a rotary drive signal to rotate the diffraction grating 3 in a direction of a two-headed arrow R using a rotary shaft 3a as a fulcrum, thereby setting an incident angle $\theta$ of the light beam which is incident from the lens 2 on the diffraction grating 3.

The principle of the above laser oscillation will be described below.

Light beams incident on the diffraction grating 3 are diffracted at different angles depending on the wavelengths of the light beams. More specifically, as shown in FIG. 10, when the grating constant of the diffraction grating 3 is represented by d, and an incident angle with respect to the diffraction grating 3 is represented by $\theta$, a wavelength $\lambda$ at which an exit angle $\beta$ is obtained satisfies the following equation:

$$m\lambda = d(\sin\theta + \sin\beta), \tag{1}$$

(where m is a diffracted order which can be set to $\pm 1, \pm 2, \ldots$)

Figure 11:
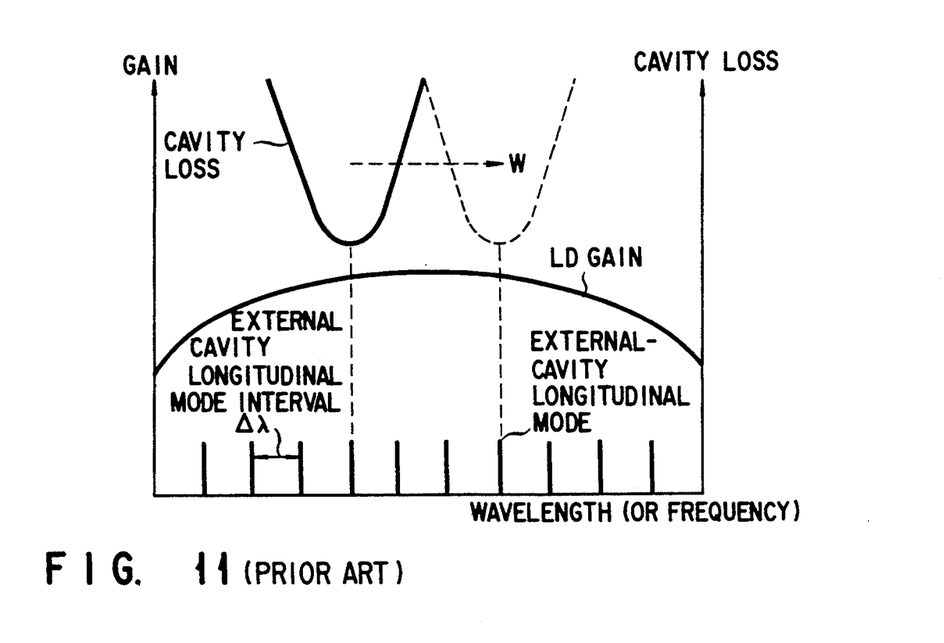
FIG. 11 is a graph for explaining the oscillation principle of an external-cavity tunable light source.

In the light beam incident on the diffraction grating 3, a light component having a wavelength which satisfies $\theta = \beta$ in equation (1) is returned to the LD 1, thereby forming a cavity (cavity length L) between the diffraction grating 3 and the LD 1. A wavelength of a laser beam oscillated at this time, as shown in FIG. 11, is determined by the gain spectrum of the LD 1, the wavelength characteristics of a cavity loss (mainly, characteristics of the diffraction grating 3), and an external-cavity longitudinal mode determined by the phase condition of a light beam. That is, the laser beam is oscillated in an external-cavity longitudinal mode at which a value obtained by subtracting the loss from the gain becomes maximum.

This external-cavity longitudinal mode is a condition for forming a standing wave when a light beam reciprocally travels in the cavity, and is given by the following equation:

$$n\lambda = 2L \tag{2}$$

(n: a natural number, L: the above cavity length)

At this time, each external-cavity longitudinal mode interval $\Delta\lambda$ is given by:

$$\Delta\lambda = \lambda^2 / 2L \tag{3}$$

Referring to FIG. 11, when the incident angle $\theta$ with respect to the diffraction grating 3 is changed, a wavelength at which the loss of the cavity becomes minimum changes in the direction of a two-headed arrow W indicated by a dotted line in FIG. 11. More specifically, according to this scheme, when the diffraction grating 3 is rotated, an arbitrary external-cavity longitudinal mode can be selected within a range in which the LD 1 has a large gain width.

Note that, in order to sequentially oscillate laser beams in the external-cavity longitudinal modes shown in FIG. 11, the diffraction grating 3 is rotated, and the incident angle $\theta$ must be set at external-cavity longitudinal mode intervals $\Delta\lambda$.

At this time, the selectivity of the external-cavity longitudinal modes depends on the resolving power of the diffraction grating 3.

In the external-cavity tunable wavelength light source using such a diffraction grating, the following conditions must be satisfied to realize the tunable wavelength light source:

① A spectral line width is decreased.

② A side mode suppression ratio is increased, i.e., the influences of modes except for a selected external-cavity longitudinal mode are reduced.

In order to realize the condition ①, in FIG. 9, a distance between the LD 1 and the diffraction grating 3, i.e., the cavity length L, must be increased. However, in this case, the following problems (a) and (b) are posed.

(a) As is apparent from equation (3), when the cavity length L is increased, an external-cavity longitudinal mode interval $\Delta\lambda$ decreases. For this reason, since the selectivity of the external-cavity longitudinal modes of the diffraction grating 3 is degraded, the reproducibility of an oscillation wavelength is degraded. In addition, since a cavity loss difference between the modes decreases, a side mode suppression ratio decreases. Therefore, the condition ② is not satisfied.

In order to solve this, the resolving power of the diffraction grating 3 may be increased. However, the resolving power of the diffraction grating 3 is proportional to a grating constant d, and this grating constant d is minimized to a physical limit at present.

In order to solve the problem (a) and satisfy the condition ②, in FIG. 9, a method of inserting an optical filter (wavelength filter) into a cavity constituted by the LD 1 and the diffraction grating 3 to improve the selectivity of external-cavity longitudinal modes is considered.

As a scheme for realizing this method, a scheme in which a Fabry-Perot etalon (to be referred to as an etalon hereinafter) is used as an optical filter is conventionally proposed ("External-Cavity Laser Design and Wavelength Calibration" HP Journal, 1993, February pp. 20–27). However, this scheme has the following problem.

(b) Although a setting precision for the cavity length of the etalon requires a $10^{-12}$m order, this cavity length is difficult to be controlled. In addition, in order to avoid that the reflected light beam of a light beam incident on the etalon is returned to the LD 1, the etalon must be arranged to be inclined with respect to an optical axis. For this reason, the cavity length is more difficult to be controlled.

The above explanation will be more exactly described below.

The FSR (Free Spectrum Range) of the etalon is determined by a distance l between two mirrors as follows:

$$FSR = C/2nl$$

(where C: light velocity, n: refractive index).

For example, assuming that the FSR is set to be 50 GHz, nl≃3 mm in a normal state, n≃1, in air.

A change amount $\Delta l$ of l required when a transmission peak wavelength is changed by $\Delta\lambda$ is expressed by $$\Delta l = l \cdot \Delta\lambda/\lambda$$

In order to obtain a change represented $\Delta\lambda = 1$ pm when $\lambda = 1.5$ μm, $\Delta \simeq 2 \times 10^{-12}$m must be satisfied. It is difficult to satisfy this condition by means of a mechanical device.

SUMMARY OF THE INVENTION

It is, therefore, an object of the present invention to provide a new and improved tunable wavelength light source which can solve the above problems and reliably select the same external-cavity longitudinal mode with a simple control system.

According to one aspect of the present invention, there is provided a tunable wavelength light source, comprising: a semiconductor laser having first and second opposing facets each of which can emits a laser beam, the first facet being anti-reflection-coated; a diffraction grating arranged on an optical path of the laser beam emerging from the first facet to spectrally disperse the laser beam emerging from the first facet of the semiconductor laser at a predetermined resolving power, return only a light component having a specific wavelength to the first facet, and constitute an external cavity between the second facet of the semiconductor laser and a spectral dispersion surface of the diffraction grating; an interferometer arranged on an optical path in the external cavity to demultiplex the laser beam emerging from the first facet of the semiconductor laser into first and second optical paths having a predetermined optical path length difference therebetween, multiplex demultiplexed light components, and output an interference light beam having a transmittance maximized at a predetermined wavelength toward the diffraction grating, thereby causing the interferometer to substantially serve as an optical filter for limiting a wavelength band of the laser beam, and the interferometer being arranged such that a resolving power of the optical filter is higher than the predetermined resolving power of the diffraction grating; and tuning means for tuning the predetermined optical path length difference between the first and second optical paths of the interferometer to tune a wavelength of the laser beam externally emerging from the second facet of the semiconductor laser.

Additional objects and advantages of the invention will be set fourth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Reference will now be made in detail to the presently preferred embodiments of the invention as illustrated in the accompanying drawings, in which like reference characters designate like or corresponding parts throughout the several drawings.

The principle of the present invention will be described below first.

In order to solve the above problems, according to the present invention, attention is paid to the following points. That is, as an optical filter for improving the selectivity of external-cavity longitudinal modes, an interferometer can be used in which a light beam is demultiplexed into two light components to form an optical path difference, and the two light components are multiplexed to cause interference. Two interference light beams can be extracted from such an interferometer.

For this purpose, according to an embodiment of the present invention, a tunable wavelength light source comprises an interferometer serving as an optical filter and a means for tuning the optical path difference (i.e., a wavelength band of a light beam which passes the optical filter).

According to another embodiment of the present invention, a tunable wavelength light source comprises a control means for detecting one interference light beam extracted from an interferometer serving as an optical filter and controlling a tuning means on the basis of this detection signal so as to automatically adjust the optical path difference of the interferometer.

An interferometer which can be used as an optical filter will be described below using a Mach-Zehnder interferometer (to be referred to as an MZ interferometer hereinafter) as an example.

Figure 2:
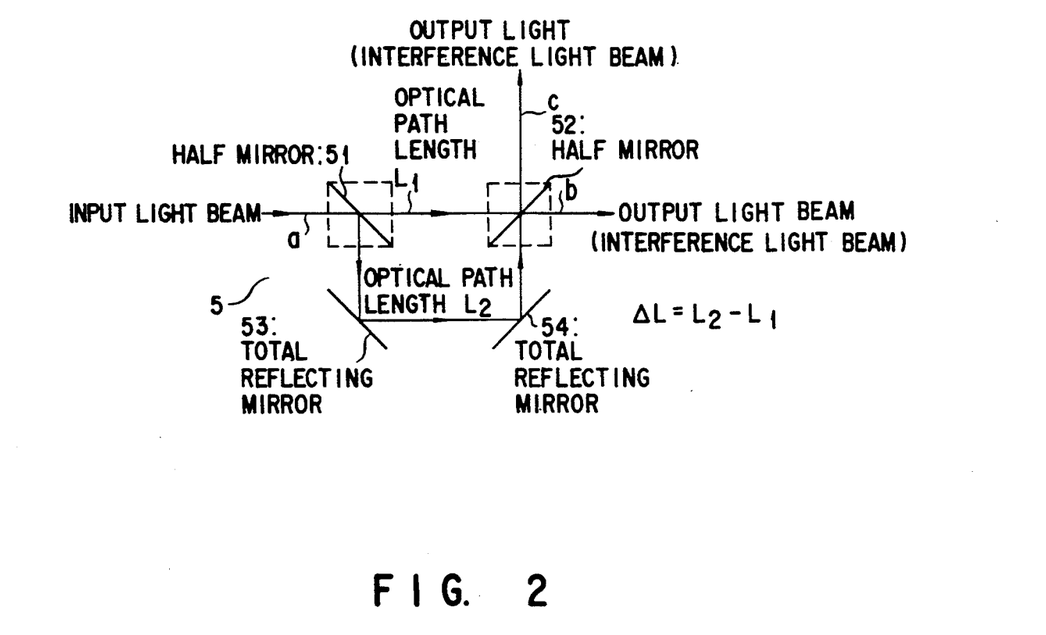
FIG. 2 is a view showing the basic arrangement of the MZ interferometer in FIG. 1.

An MZ interferometer 5, as shown in FIG. 2, is constituted by two half mirrors 51 and 52 and two total reflecting mirrors 53 and 54. An input light beam a is demultiplexed into two light components by the half mirror 51. One light component is directly input to the half mirror 52, and the other light component is input to the half mirror 52 through the total reflecting mirrors 53 and 54, thereby multiplexing the two light components. At this time, interference between the two light components occurs, and the light beam obtained by multiplexing the two light components becomes an interference light beam. Two interference light beams (output light beams b and c) are output from the half mirror 52.

In this case, optical characteristics obtained when the MZ interferometer 5 is used as an optical filter will be described below. When an optical path difference between an optical path length $L_1$ of the light beam which emerges from the half mirror 51 and directly reaches the half mirror 52 and an optical path length $L_2$ of the light beam which emerges from the half mirror 51 and reaches the half mirror 52 through the two total reflecting mirrors 53 and 54 is represented by $\Delta L$, the optical filter has a free spectrum range (FRS) expressed by the following equation:

$$FSR = C/\Delta L \qquad (4)$$

(C: light velocity)

Figure 3:
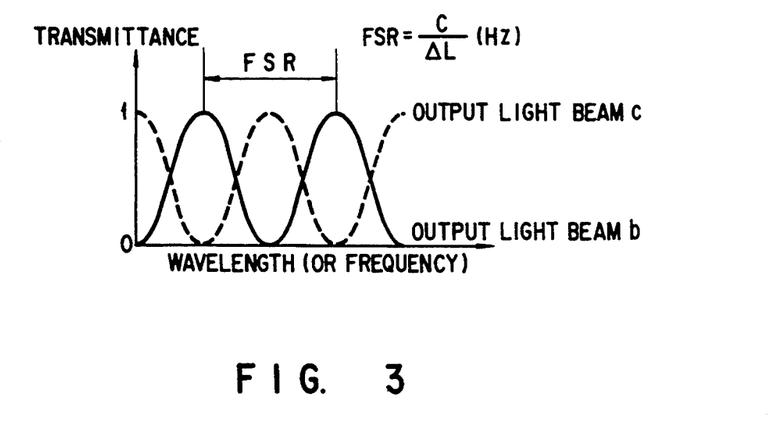
FIG. 3 is a graph showing the wavelength characteristics of the transmittance of the MZ interferometer in FIG. 1.

When this equation is expressed as a function of the wavelength characteristics (or frequency characteristics) of a transmittance which is a ratio of an output light beam intensity to an input light beam intensity, the graph shown in FIG. 3 is obtained. The following facts can be found from FIG. 3. That is, the transmittance can be periodically changed within a range of 0 to 1 with respect to the wavelength, and a peak wavelength (wavelength at which a transmittance of 0 or 1 is obtained) can be changed by changing the optical path difference $\Delta L$. In addition, it is found that the output light beam b output from the half mirror 52 has a characteristic curve obtained by inverting the characteristic curve of the output light beam c.

Therefore, when a wavelength at which a transmittance of 1 is obtained by tuning the optical path difference $\Delta L$ is adjusted to the wavelength of an external-cavity longitudinal mode to be oscillated, the MZ interferometer 5 can be used as an optical filter for improving the selectivity of external-cavity longitudinal modes.

In addition, since two interference light beams each having a uniform characteristic curve can be extracted as the output light beams b and c from the MZ interferometer 5, one interference light beam having a transmittance of 1 emerges toward a diffraction grating, and the other interference light beam having a transmittance of 0 can be used as a control signal for stabilizing the optical path difference $\Delta L$ of the MZ interferometer 5. More specifically, when a wavelength at which a transmittance of 0 can be obtained is detected, and the optical path difference $\Delta L$ changes due to a change in temperature or the like, the optical path difference $\Delta L$ can be controlled (corrected) such that the transmittance is always set to be 0 (in other words, the interference light beam emerging toward the diffraction grating is set to be 1).

Note that, since the setting precision of the optical difference $\Delta L$ is set to be satisfactorily set to be a $10^{-8}$m order, the MZ interferometer can be controlled considerably easier than the above etalon (requiring a $10^{-12}$m order).

Several embodiments of the present invention based on the above principle will be described below with reference to the accompanying drawings.

(First Embodiment)

Figure 1:
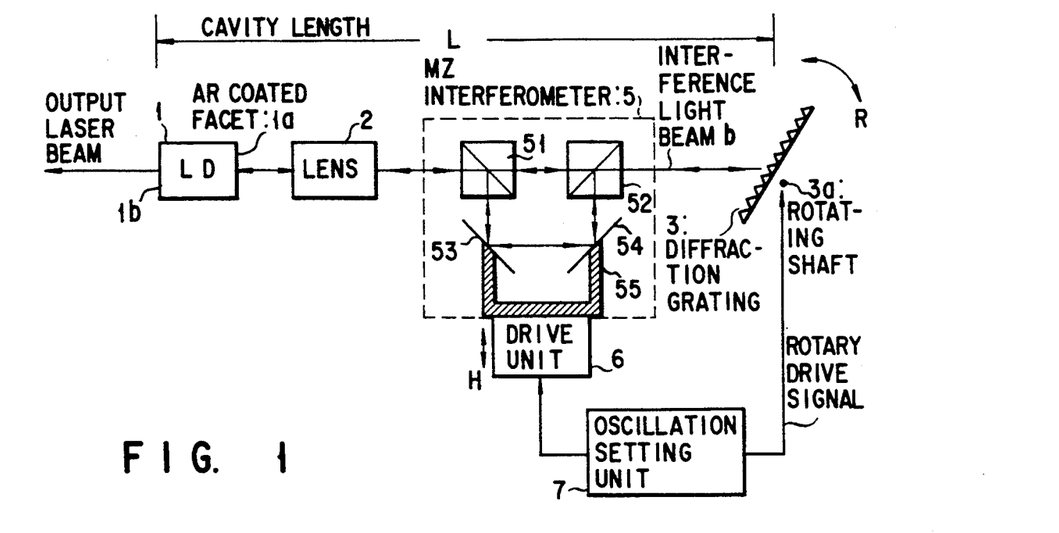
FIG. 1 is a block diagram of a tunable wavelength light source using a Mach-Zehnder (MZ) interferometer to show the first embodiment of the present invention.

FIG. 1 is a block diagram showing the arrangement of a tunable wavelength light source using an MZ interferometer 5 as an optical filter to show the first embodiment of the present invention. Note that the same reference numerals as in the prior art denote the same parts in this embodiment.

A light beam emerging from an AR-coated facet a of an LD 1 is converted into a collimated beam, and the collimated beam is incident on the MZ interferometer 5 serving as an optical filter. One (interference light beam b) of interference light beams generated by the MZ interferometer 5 on the basis of the above principle emerges toward a diffraction grating 3. A light component whose wavelength is selected by spectrally dispersing the interference light beam b and satisfies $m\lambda = 2d\sin\theta$ (equation (1)) reversely travels in the same optical path as that of the interference light beam b and is returned to the LD 1.

In this manner, an external cavity (cavity length L) is formed between a facet b of the LD 1 which is not AR-coated and the diffraction grating 3, and a laser beam having a wavelength determined the three relationships between an external-cavity longitudinal mode determined by the cavity length L, a cavity loss caused by the diffraction grating 3, and the output characteristics of the interference light beam b from the MZ interferometer 5 is oscillated.

These relationships are described in detail using FIGS. 5A, 5B, 5C, and 5D. More specifically, of external-cavity longitudinal modes (e.g., ①, ②, and ③) in FIG. 5D, a laser beam is oscillated in the external-cavity longitudinal mode ①  which satisfies two conditions, i.e., has a minimum cavity loss caused by the diffraction grating 3 and a maximum output (transmittance) of the interference light beam b from the MZ interferometer 5.

Although the wavelength characteristics (FIG. 5B) of the output (transmittance) of the interference light beam b emerging from the MZ interferometer 5 is determined by an optical path difference $\Delta L$ of the MZ interferometer 5 as described above, a practical determination of the optical path difference $\Delta L$ will be described below. Although a tunable wavelength light source requires a spectral line width of 1 MHz or less, in order to realize this, a cavity length of several tens mm is required. Therefore, a case wherein the cavity length L is set to be 30 mm will be described below.

More specifically, in a tunable wavelength light source having a 1.5 μm band, when the cavity length L in FIG. 1 is set to be 30 mm, an external-cavity longitudinal mode interval $\Delta V$ is set to be 5 GHz (FIG. 5D) according to $\Delta V = C/2L$. In addition, the resolving power of the diffraction grating 3 is a maximum of about 50 GHz (FIG. 5A) at present. On the other hand, since a light beam emerging from the LD 1 reciprocally travels in the MZ interferometer 5, the MZ interferometer 5 can obtain an effect twice that of an optical filter in which a light beam travels in one direction. In consideration of the above facts, a resolving power (FIG. 5B), i.e., an FSR, obtained when the MZ interferometer 5 is used as an optical filter is preferably set to be about twice (10 GHz) the external-cavity longitudinal mode interval. This resolving power can be achieved by setting the optical path difference $\Delta L$ to be 11 mm according to equation (4).

In order to practically select this longitudinal mode with good reproducibility, a loss difference between adjacent longitudinal modes is satisfactorily set to be 3 dB. For this reason, when the optical path difference $\Delta L$ is set to be 11 mm, FSR = 27.5 GHz is obtained. As shown in FIG. 5E, a loss at a point spaced apart from the top point by a distance corresponding to 5 GHz can be set to be 3 dB (when a light beam reciprocally travels).

In this case, not only the adjacent mode ② but also other longitudinal modes ③ and ④ can be suppressed, and an SMSR (Side Mode Suppression Ratio) and a selectivity can be improved.

The above results can be based on the fact that, in an equation $y = \frac{1}{2}\cos(2\pi \cdot x/FSR) + \frac{1}{2}$ (y: transmittance, x: frequency offset amount from the top) expressing the transmittance of the optical filter, assuming that x = 5 and FSR = 27.5, $y = 1/\sqrt{2}$ (−1.5 dB) is obtained.

In addition, the MZ interferometer 5 comprises a drive unit (turning means such as an actuator) 6 connected to a mount 55 for supporting total reflecting mirrors 53 and 54. The two total reflecting mirrors 53 and 54 interlocked with each other are moved in the direction of a two-headed arrow H, i.e., an optical path length $L_2$ shown in FIG. 2 is changed, so as to tune the $\Delta L$ of the MZ interferometer 5 on, e.g., a 1- to 2-μm order. Note that a piezoelectric (PZT) element or the like can be used as the drive unit 6.

An oscillation wavelength setting unit 7 is constituted by a microprocessor and the like. The oscillation wavelength setting unit 7 controls the above drive unit 6 and sets an incident angle $\theta$ at which the interference light beam b is incident on the diffraction grating 3. Therefore, as shown in FIG. 5D, when an oscillation wavelength is tuned from the cavity longitudinal mode ① to the cavity longitudinal mode ② or ③, the optical path difference $\Delta L$ of the MZ interferometer 5 and the incident angle $\theta$ of the diffraction grating 3 are respectively set and controlled by the oscillation wavelength setting unit 7.

In the above arrangement, since the selectivity of external-cavity longitudinal modes can be improved by using the MZ interferometer 5 as an optical filter (more specifically, in FIG. 5D, a loss difference between the external-cavity longitudinal mode ① and the external-cavity longitudinal mode ② and a loss difference between the external-cavity longitudinal mode ① and the external-cavity longitudinal mode ③ increase within the cavity), only one mode (e.g., ①) can be stably oscillated with reproducibility better than that of the prior art, and a side mode suppression ratio (more specifically, a level difference between the external-cavity longitudinal mode ① and the external-cavity longitudinal mode ② and a level difference between the external-cavity longitudinal mode ① and the external-cavity longitudinal mode ③) can be considerably increased.

(Second Embodiment)

Figure 4:
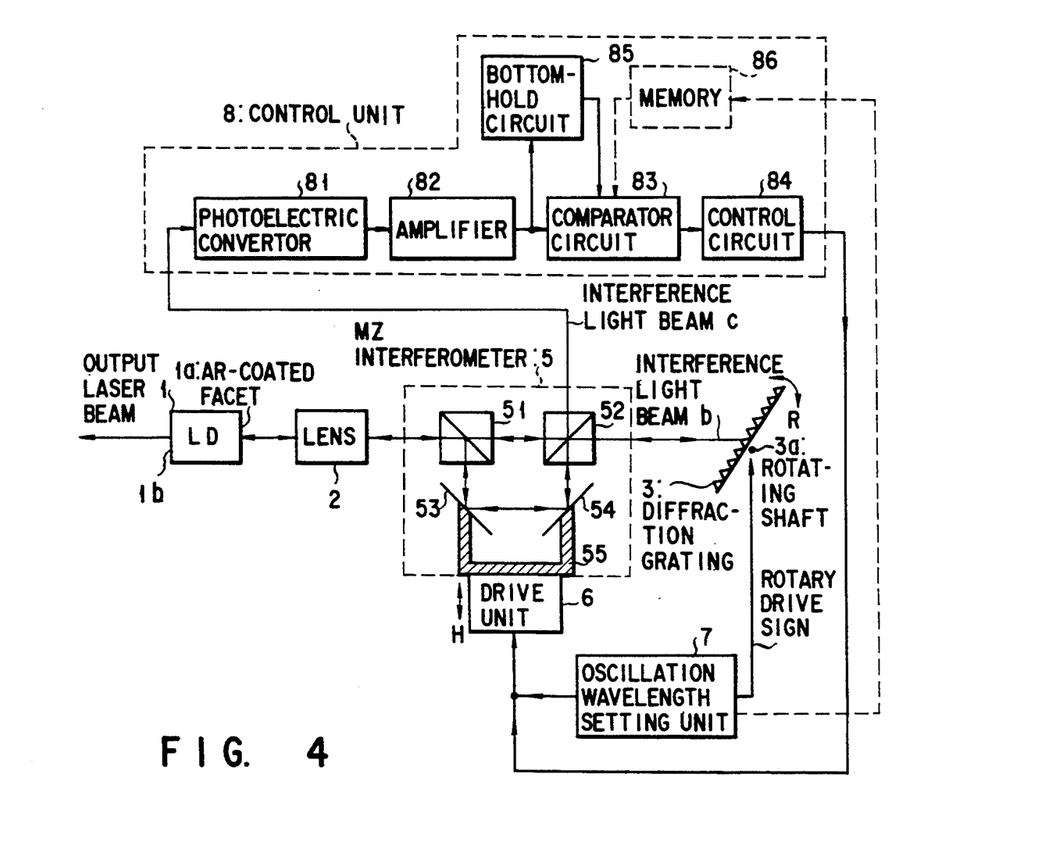
FIG. 4 is a block diagram of a tunable wavelength light source using an MZ interferometer and a control loop to show the second embodiment of the present invention.

FIG. 4 is a block diagram of a tunable wavelength light source using an MZ interferometer and a control loop to show the second embodiment of the present invention.

In this embodiment, a control unit 8 is added to the arrangement of the first embodiment (FIG. 1), one interference light beam c of two interference light beams b and c emerging from a MZ interferometer 5 and respectively having inverted uniform characteristics is detected, and the detection signal is fed back to a drive unit 6, thereby automatically adjusting an optical path difference $\Delta L$ of the MZ interferometer 5. Therefore, a description of parts commonly used in the first and second embodiments will be omitted.

Figure 5A:
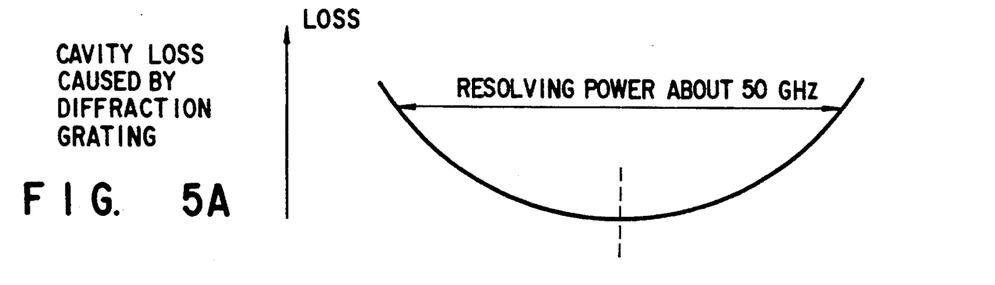
FIGS. 5A, 5B, 5C, 5D, and 5E are graphs for explaining the operation of a tunable wavelength light source using an MZ interferometer.
Figure 5B:
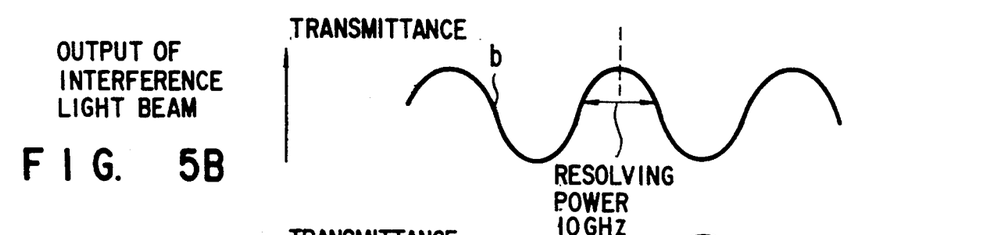
Figure 5C:
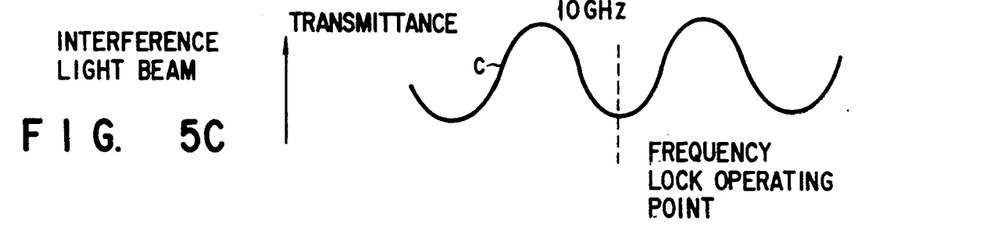
Figure 5D:
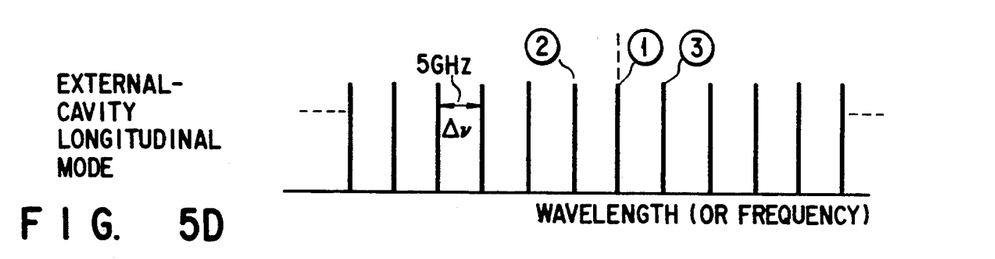
Figure 5E:
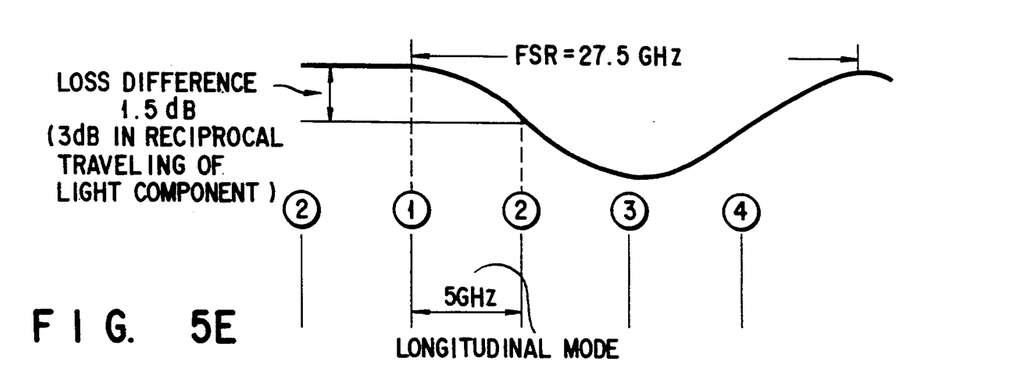

An interference light beam c (corresponding to the output light beam c in FIG. 2) emerging from the MZ interferometer 5, as shown in FIG. 5B, has a characteristic curve obtained by inverting the characteristic curve of the interference light beam b (corresponding to the output light beam b in FIG. 2) incident on a diffraction grating 3.

The interference light beam c emerging from the MZ interferometer 5 is incident on a photoelectric converter 81 and is converted into an electrical signal. This electrical signal output from the photoelectric converter 81 is amplified by an amplifier 82 and then input to a comparator circuit 83. The comparator circuit 83 compares a reference voltage (to be described later) with a voltage from the amplifier 82 to detect the minimum point (frequency lock operating point) of the transmittance of the interference light beam c shown in FIG. 5C, thereby outputting a difference voltage with respect to the reference voltage.

A control circuit 84 is constituted by a microprocessor and the like. The control circuit 84 receives the difference voltage output from the comparator circuit 83 and controls the drive unit 6 such that the difference voltage becomes zero, in other words, the interference light beam c is minimized. More specifically, the drive unit 6 is controlled such that the frequency lock operating point (the interference light beam c in FIG. 5) coincides with an external-cavity longitudinal mode 1 (FIG. 5D). In this manner, a control (negative feedback) loop for controlling a variation in optical path difference ΔL of the MZ interferometer 5 is formed.

Note that, a voltage output from the amplifier 82 through a bottom-hold circuit 85 before the optical path difference ΔL is changed by the control circuit 84 is used as the reference voltage of the comparator circuit 83, and the reference voltage may be replaced with, as a new reference voltage, one having a small value and selected from the reference voltage and the voltage from the amplifier 82 each time the optical path difference ΔL is controlled by the control circuit 84. This is because the next control is performed using the previous state as a reference, i.e., control is performed setting a relative reference (reference voltage). In addition, as another method, as indicated by a broken line in FIG. 4, a voltage output from the amplifier 82 when the transmittance of the interference light beam c is minimized in each external-cavity longitudinal mode is stored in a memory 86 in advance, and this voltage may be read out from the memory 86 and used as a reference voltage each time an oscillation wavelength (i.e., an external-cavity longitudinal mode) is set by an oscillation wavelength setting unit 7. This is because control is performed using an absolute reference (reference voltage).

The above photoelectric converter 81, the amplifier 82, the comparator circuit 83, the control circuit 84, and the bottom-hold circuit 85 or the memory 86 constitute the control unit 8.

In the above arrangement, the MZ interferometer 5 is used as an optical filter, and the interference light beam c of the two interference light beams b and c emerging from the MZ interferometer 5 is detected, thereby controlling the drive unit 6. For this reason, even if the optical path difference ΔL of the MZ interferometer 5 was changed due a change in temperature or the like, the optical path difference ΔL could be automatically controlled such that the center (point at which the maximum transmittance was obtained) of a wavelength band of a light beam which passed the MZ interferometer 5 serving as an optical filter coincided with the wavelength of an external-cavity longitudinal mode. Therefore, a tunable wavelength light source stabler than that of the first embodiment can be realized.

(Third Embodiment)

Figure 6:
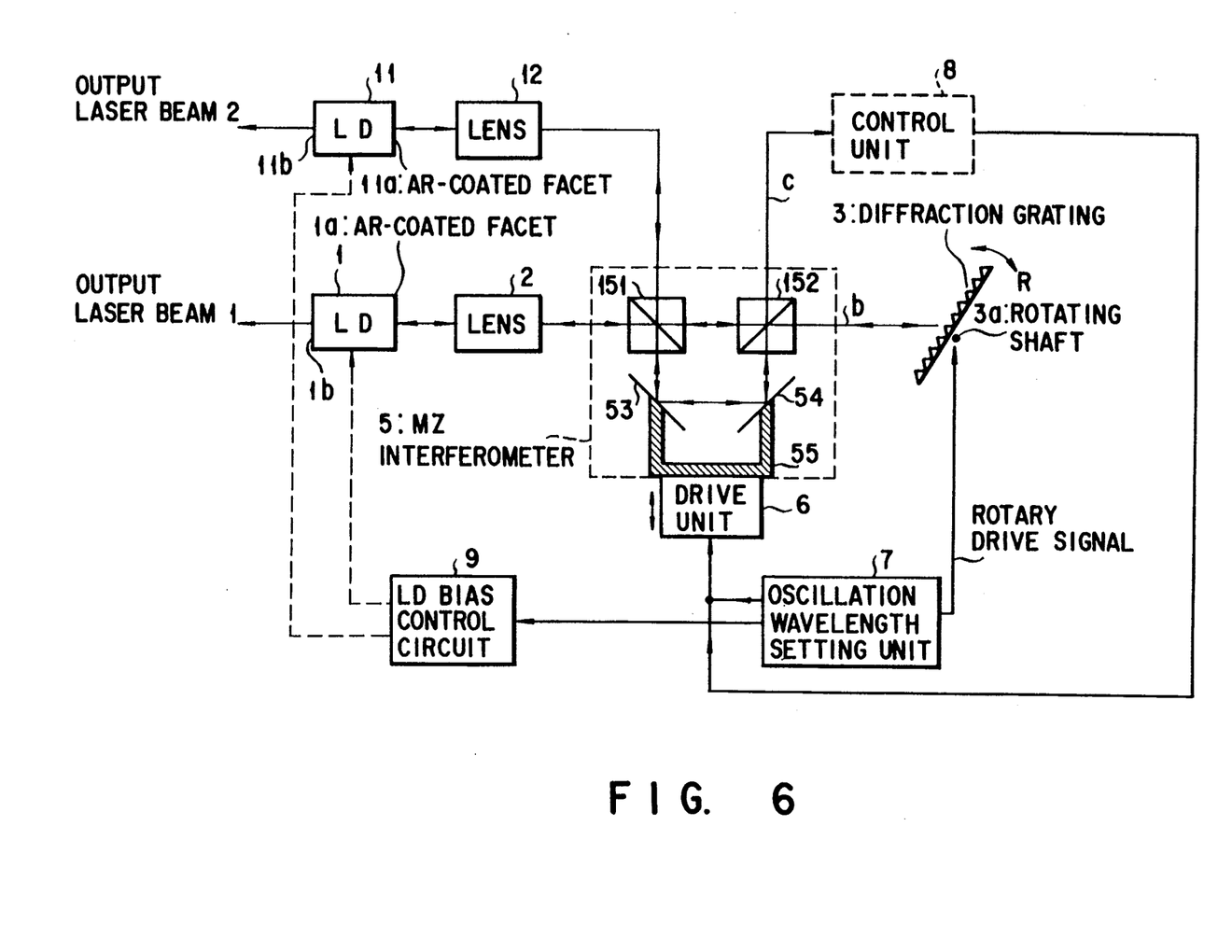
FIG. 6 is a block diagram of a tunable wavelength light source having a wide tunable range using an MZ interferometer to show the third embodiment of the present invention.

FIG. 6 is a block diagram of a tunable wavelength light source having a band widened by using an MZ interferometer to show the third embodiment of the present invention.

In this embodiment, an LD 11, a lens 12, and an LD bias control circuit 9 are added to the arrangement of the second embodiment (FIG. 4) to constitute two cavities, and an oscillation wavelength band is widened by performing a switching operation between an LD 1 and the LD 11 to be oscillated. Therefore, a description of parts commonly used in the second and third embodiments will be omitted.

A light beam emerging from the LD 1 is incident on a diffraction grating 3 through a lens 2 and an MZ interferometer 5, is spectrally dispersed, and only a light component having a specific wavelength is returned to the LD 1. In this manner, the first cavity is formed. This cavity is substantially the same as the cavity in FIG. 4.

A light beam emerging from the LD 11 is incident on a half mirror 51 of the MZ interferometer 5 through the lens 12, is incident on the diffraction grating 3 through the MZ interferometer 5, and is spectrally dispersed, and only a light component having a specific wavelength is returned to the LD 11. In this manner, the second cavity is formed.

The LD bias control circuit 9 receives oscillation wavelength information from an oscillation wavelength setting unit 7, selects one of the LDs 1 and 11, and causes the selected one to oscillate a laser beam.

In the above arrangement, the first and second cavities are formed through the MZ interferometer 5, and one of these cavities can be selected by the LD bias control circuit 9. For this reason, the characteristic feature of the second embodiment could be kept, and an oscillation wavelength band could be widened. For example, when laser diodes having a 1.5-μm band and a 1.3-μm band are used as the LDs 1 and 11, respectively, only one tunable wavelength light source is required, although two tunable wavelength light sources are required in a conventional technique.

(Fourth Embodiment)

Figure 7A:
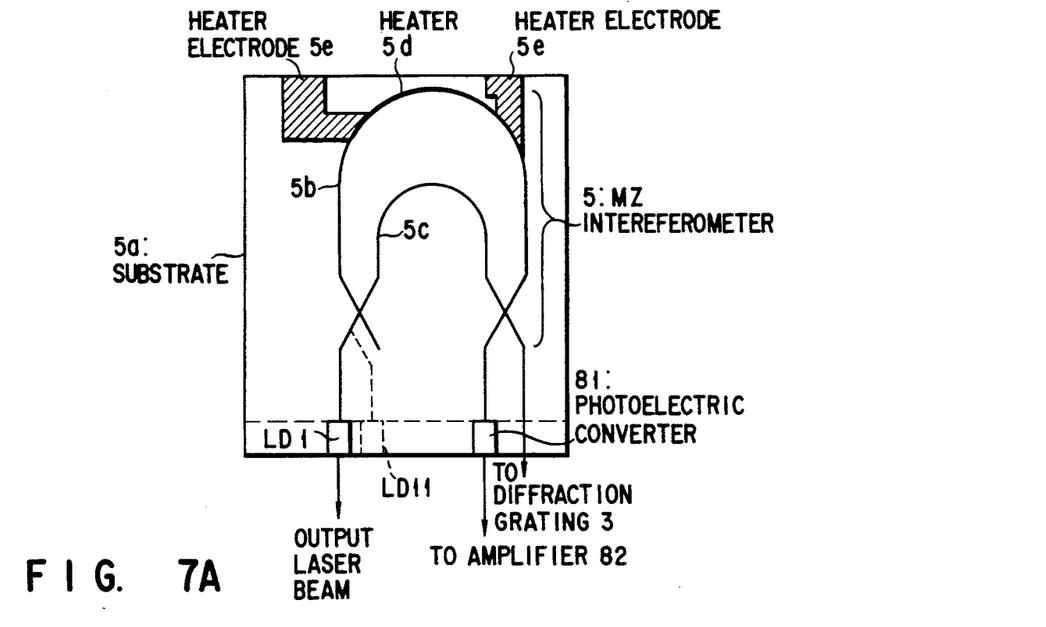
FIGS. 7A and 7B are views respectively showing the partial and entire arrangements of a tunable wavelength light source, having part which is formed as an optical integrated circuit, to show the fourth embodiment of the present invention.
Figure 7B:
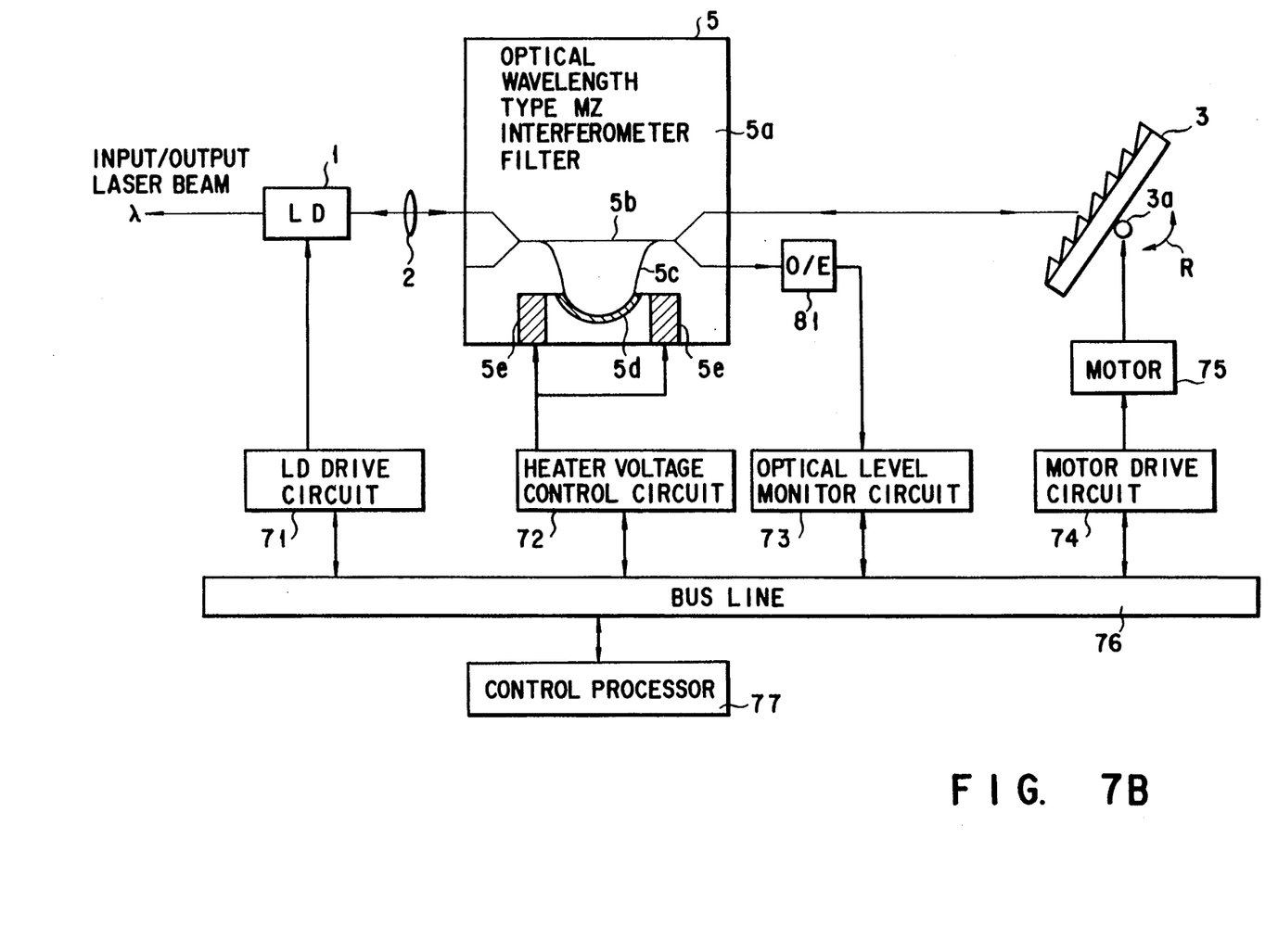

FIGS. 7A and 7B are views respectively showing the partial and entire arrangements of a tunable wavelength light source having part which is formed as an optical integrated circuit to show the fourth embodiment of the present invention.

According to this embodiment, in each of the first embodiment (FIG. 1), the second embodiment (FIG. 4), and the third embodiment (FIG. 6), an MZ interferometer 5 is constituted by an optical waveguide type MZ interferometer constituted by two optical waveguides 5b and 5c formed on a substrate 5a having, e.g., an LiNbO₃ crystal, and an LD 1 and a photoelectric converter 81 (FIG. 4) are formed on or coupled with the substrate 5a. In this case, a heater 5d and a heater electrode 5e formed on or coupled with the substrate 5a serve similarly to a drive unit 6 in FIG. 4. More specifically, a temperature around the optical waveguide 5b is changed by a heater 5d to tune one optical path length (in other words, an optical path difference ΔL) of the interferometer. The substrate 5a of this optical integrated circuit has a size of, e.g., about 10 mm × 10 mm. Note that the technique in the third embodiment of the invention disclosed in Jpn. Pat. Appln. KOKAI Publication No. 61-80109 can be utilized for an optical waveguide type MZ interferometer.

As described above, the MZ interferometer or the like can be formed as an optical integrated circuit. For this reason, the characteristic features of the first, second, and third embodiments could be kept, and a very compact tunable wavelength light source could be realized.

Note that, in FIG. 7B, the LD 1 is driven by an LD drive circuit 71. A heater voltage control circuit 72 applies a control voltage to the heater electrode 5e. An output from the photoelectric converter 81 is monitored by an optical level monitor circuit 73, and is used through a bus line 76 and a control processor 77 to control a voltage applied to the heater 5d. A rotating shaft 3a of a diffraction grating 3 is rotated through a motor drive circuit 74 and a motor 75. The control processor 77 controls the above circuits 71 to 74 through the bus line 76.

(Fifth Embodiment)

Figure 8A:
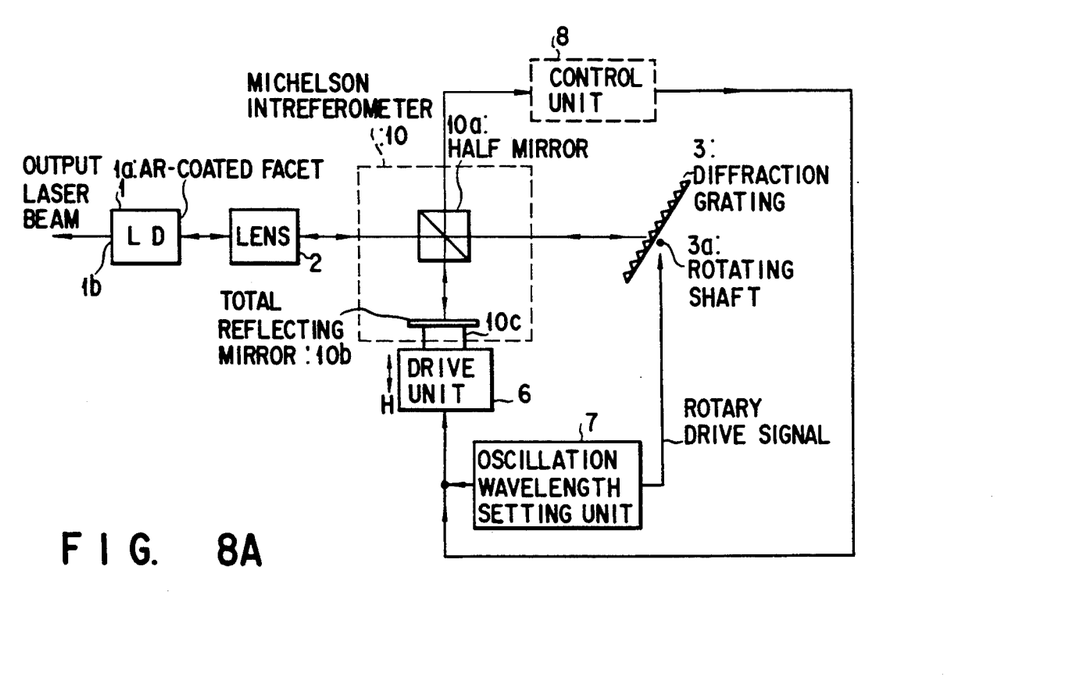
FIG. 8A is a block diagram of a tunable wavelength light source using a Michelson interferometer and a control loop to show the fifth embodiment of the present invention.

FIG. 8A is a block diagram showing the arrangement of a tunable wavelength light source using a Michelson interferometer and a control loop to show the fifth embodiment of the present invention.

According to this embodiment, a Michelson interferometer is used as an interferometer serving as an optical filter, and the MZ interferometer 5 in the second embodiment (FIG. 4) is replaced with a Michelson interferometer 10. Therefore, a description of parts commonly used in the second embodiment (FIG. 4) and the fourth embodiment will be omitted.

The Michelson interferometer 10, as shown in FIG. 8A, is constituted by one half mirror 10a and one total reflecting mirror 10b. An optical path difference is tuned such that the total reflecting mirror 10b supported by a mount 10c is moved by a drive unit 6 in the direction of a two-headed arrow H.

Note that, since an effect obtained when the Michelson interferometer 10 is used as an optical filter is ½ that obtained when the MZ interferometer 5 is used as an optical filter, the selectivity of external-cavity longitudinal modes is slightly degraded when the Michelson interferometer 10 is used as a tunable wavelength light source.

(Sixth Embodiment)

Figure 8B:
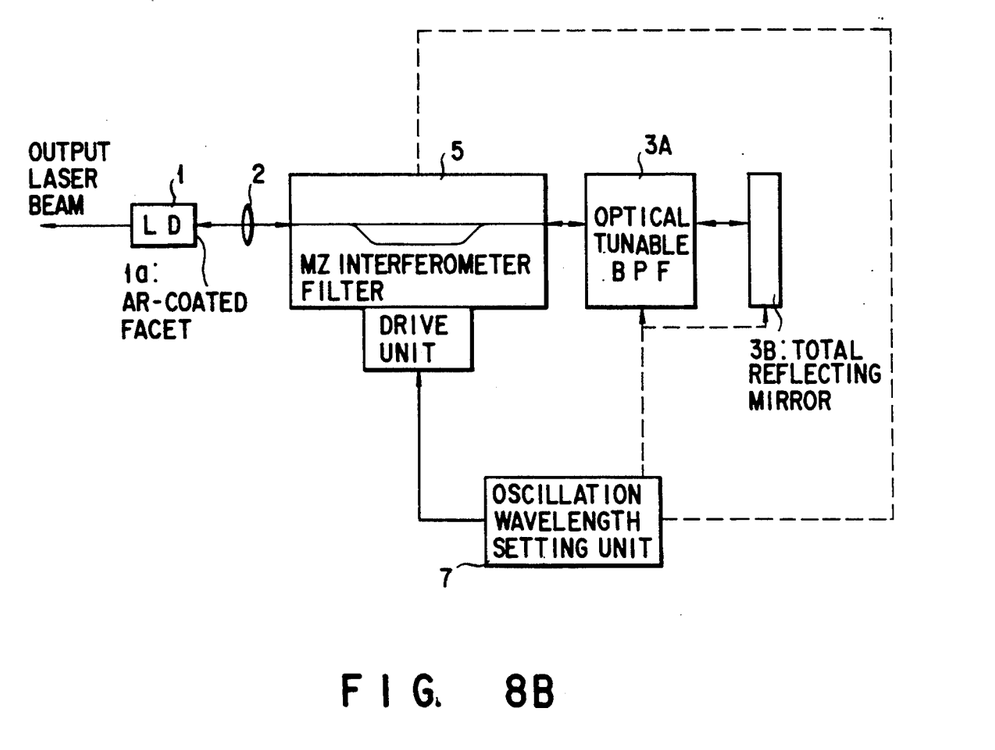
FIG. 8B is a view showing the sixth embodiment of the present invention in which an optical tunable wavelength filter (BPF) is used in place of a diffraction grating.

FIG. 8B shows the sixth embodiment in which a transmission tunable wavelength filter (optical bandpass filter: BPF) 3A and a total reflecting mirror 3B are used in place of the diffraction grating 3 which serves as a preselector in each of the above embodiments.

Figure 8C:
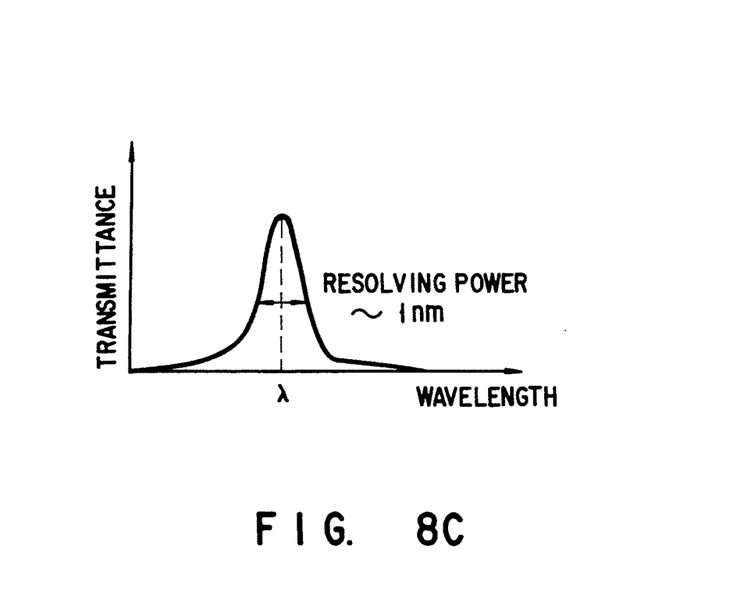
FIG. 8C is a graph showing the transmittance characteristics of the optical wavelength tuning filter in FIG. 8B.

More specifically, in the sixth embodiment, an output light beam from an MZ interferometer 5 is input to the optical BPF 3A. In this case, the optical BPF 3A has transmission characteristics which give a resolving power of about 1 nm and are shown in FIG. 8C, and the optical BPF 3A transmits only a light component having a predetermined wavelength $\lambda$. The transmitted light component from the optical BPF 3A is reflected by the total reflecting mirror and returned to the MZ interferometer 5 through the optical BPF 3A.

In this embodiment, an external cavity (cavity length L) is formed between an LD 1 and the total reflecting mirror 3B, thereby realizing a tunable wavelength light source having the same function as that of each of the above embodiments.

(Still Another Embodiment)

As still another embodiment, in each of the above embodiments, a piezoelectric element or the like is arranged in, e.g., a diffraction grating 3, as a tuning means for tuning a cavity length of a cavity formed between an LD 1 and the diffraction grating 3. In this manner, the position of an external-cavity longitudinal mode can be arbitrarily changed, i.e., a light beam having an arbitrary wavelength can be oscillated.

As has been described above, in a tunable wavelength light source according to the present invention, an interferometer serving as an optical filter and a means for tuning the optical path difference of the interferometer are arranged in the optical path of a cavity constituted by a semiconductor laser and a diffraction grating. For this reason, an external-cavity longitudinal mode could be selected with good reproducibility, a side mode suppression ratio could be increased, and a spectral line width could be decreased.

In addition, in another embodiment of the present invention, a control means which detects part of an interference light beam extracted from an interferometer serving as an optical filter and feeds back the detection signal to a tuning means to adjust the optical path difference of the interferometer is arranged. For this reason, even if the optical path difference of the interferometer changes due to a change in temperature or the like, the optical path difference can be automatically corrected. As a result, the tunable wavelength light source according to the above embodiment could be further stabilized.

In addition, in still another embodiment of the present invention, two laser diodes (LDs) can be used in two cavities since two input light beams can be input to an interferometer serving as two optical filters, so that a tunable wavelength ban can be widened.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

what is claimed is:

1. A tunable wavelength light source, comprising:
a semiconductor laser having first and second opposing facets each of which emits a laser beam, said first facet being anti-reflection-coated;
a diffraction grating arranged on an optical path of the laser beam emerging from said first facet to spectrally disperse the laser beam emerging from said first facet of said semiconductor laser at a predetermined resolving power, and returning only a light component having a specific wavelength to said first facet, and an external cavity between said second facet of said semiconductor laser and a spectral dispersion surface of said diffraction grating;
an interferometer arranged on an optical path in said external cavity to demultiplex the laser beam emerging from said first facet of said semiconductor laser into first and second optical paths having a predetermined optical path length difference therebetween, multiplex demultiplexed light components, and output an interference light beam having a transmittance maximized at a predetermined wavelength toward said diffraction grating, thereby causing said interferometer to substantially serve as an optical filter for limiting a wavelength band of the laser beam, and said interferometer being arranged such that a resolving power of the optical filter is higher than the predetermined resolving power of said diffraction grating; and
tuning means for tuning the predetermined optical path length difference between the first and second optical paths of said interferometer to tune a wavelength of the laser beam externally emerging from said second facet of said semiconductor laser.

2. A source according to claim 1, wherein said interferometer includes a Mach-Zehnder interferometer.

3. A source according to claim 2, wherein said Mach-Zehnder interferometer comprises:
a first half mirror for demultiplexing the laser beam emerging from said first facet of said semiconductor laser into the first and second optical paths;
a first total reflecting mirror for turning a laser beam from said first half mirror in a predetermined direction on the second optical path;
a second total reflecting mirror for turning the laser beam from said first total reflecting mirror toward the first optical path on the second optical path; and
a second half mirror for multiplexing the laser beam from said first half mirror and a laser beam from said second total reflecting mirror on the first optical path to output the interference light beam.

4. A source according to claim 3, wherein said Mach-Zehnder interferometer further comprises support means for commonly supporting said first and second total reflecting mirrors.

5. A source according to claim 4, wherein said tuning means includes drive means, connected to said support means, for moving said first and second total reflecting mirrors in a predetermined direction.

6. A source according to claim 2, wherein said Mach-Zehnder interferometer comprises:
a substrate on which an optical waveguide can be formed; and
first and second optical waveguides having a predetermined optical path length difference therebetween on said substrate and formed such that both end portions of said first and second optical waveguides are coupled with each other, respectively, said first optical waveguide being formed to have one end portion which receives the laser beam emerging from said first facet of said semiconductor laser to demultiplex the laser beam into said second optical waveguide and another end portion which multiplexes the laser beams from said first and second optical waveguides to cause the interference light beam to emerge.

7. A source according to claim 6, wherein said tuning means includes heater means for heating said second optical waveguide on said substrate to tune an optical path length of said second optical waveguide.

8. A source according to claim 7, wherein said semiconductor laser is formed on or coupled with said substrate.

9. A source according to claim 1, further comprising lens means for converting the laser beam emerging from said first facet of said semiconductor laser into a collimated beam to direct the collimated beam toward said interferometer.

10. A source according to claim 1, wherein said interferometer includes a Michelson interferometer.

11. A tunable wavelength light source, comprising:
a semiconductor laser having first and second opposing facets each of which emits a laser beam, said first facet being anti-reflection-coated;
a diffraction grating arranged on an optical path of the laser beam emerging from said first facet to spectrally disperse the laser beam emerging from said first facet of said semiconductor laser at a predetermined resolving power, returning only a light component having a specific wavelength to said first facet, and an external cavity between said second facet of said semiconductor laser and a spectral dispersion surface of said diffraction grating;
an interferometer arranged on an optical path in said external cavity to demultiplex the laser beam emerging from said first facet of said semiconductor laser into first and second optical paths having a predetermined optical path length difference therebetween, multiplex demultiplexed light components, output a first interference light beam having a transmittance maximized at a predetermined wavelength toward said diffraction grating, and output a second interference light beam having the transmittance minimized at a predetermined wavelength, thereby causing said interferometer to substantially serve as an optical filter for limiting a wavelength band of the laser beam, and said interferometer being arranged such that a resolving power of the optical filter is higher than the predetermined resolving power of said diffraction grating;
tuning means for tuning the predetermined optical path length difference between the first and second optical paths of said interferometer to tune a wavelength of the laser beam externally emerging from said second facet of said semiconductor laser; and
control means for detecting the second interference light beam emerging from said interferometer to feed back the second interference light beam to said tuning means, thereby controlling said optical path length difference.

12. A source according to claim 11, wherein said interferometer includes a Mach-Zehnder interferometer.

13. A source according to claim 12, wherein said Mach-Zehnder interferometer comprises:
a first half mirror for demultiplexing the laser beam emerging from said first facet of said semiconductor laser into the first and second optical paths;
a first total reflecting mirror for turning a laser beam from said first half mirror in a predetermined direction on the second optical path;
a second total reflecting mirror for turning the laser beam from said first total reflecting mirror toward the first optical path on the second optical path; and
a second half mirror for multiplexing the laser beam from said first half mirror and a laser beam from said second total reflecting mirror on the first optical path to output the first and second interference light beams.

14. A source according to claim 13, wherein said Mach-Zehnder interferometer further comprises support means for commonly supporting said first and second total reflecting mirrors.

15. A source according to claim 14, wherein said tuning means includes drive means, connected to said support means, for moving said first and second total reflecting mirrors in a predetermined direction.

16. A source according to claim 12, wherein said Mach-Zehnder interferometer comprises:
a substrate on which an optical waveguide can be formed; and
first and second optical waveguides having a predetermined optical path length difference therebetween on said substrate and formed such that both end portions of said first and second optical waveguides are coupled with each other, respectively, said first optical waveguide being formed to have one end portion which receives the laser beam emerging from said first facet of said semiconductor laser to demultiplex the laser beam into said second optical waveguide and another end portion which multiplexes the laser beams from said first and second optical waveguides to cause the interference light beam to emerge.

17. A source according to claim 16, wherein said tuning means includes heater means for heating said second optical waveguide on said substrate to tune an optical path length of said second optical waveguide.

18. A source according to claim 17, wherein said semiconductor laser and at least part of said control means are formed on or coupled with said substrate.

19. A source according to claim 11, wherein said tunable wavelength light source further comprises lens means for converting the laser beam emerging from said first facet of said semiconductor laser into a collimated beam to direct the collimated beam toward said interferometer.

20. A source according to claim 11, wherein said interferometer includes a Michelson interferometer.

21. A source according to claim 11, wherein said control means comprises:
a photoelectric converter for converting the second interference light beam emerging from said interferometer into an electrical signal;
an amplifier for amplifying the electrical signal converted by said photoelectric converter;
a comparator circuit for comparing the electrical signal amplified by said amplifier with a predetermined reference signal; and
a control circuit for feeding back a control signal for controlling the predetermined optical path length difference to said tuning means on the basis of an output signal from said comparator circuit.

22. A tunable wavelength light source, comprising:
a first semiconductor laser having first and second opposing facets each of which emits a laser beam having a predetermined wavelength, said first facet being anti-reflection-coated;
a second semiconductor laser having first and second opposing facets each of which emits a laser beam having a predetermined wavelength different from that of the first laser beam, said first facet being anti-reflection-coated;
a diffraction grating arranged on an optical path of the first or second laser beam emerging from said first facet to spectrally disperse the laser beam emerging from said first facet of said first or second semiconductor laser at a predetermined resolving power, and returning only a light component having a specific wavelength to said first facet, and an external cavity between said second facet of said first or second semiconductor laser and a spectral dispersion surface of said diffraction grating;
an interferometer arranged on an optical path in said external cavity to demultiplex the first or second laser beam emerging from said first facet of said first or second semiconductor laser into first and second optical paths having a predetermined optical path length difference therebetween, multiplex demultiplexed light components, and output an interference light beam having a transmittance maximized at a predetermined wavelength toward said diffraction grating, thereby causing said interferometer to substantially serve as an optical filter for limiting wavelength bands of the laser beams, and said interferometer being arranged such that a resolving power of the optical filter is higher than the predetermined resolving power of said diffraction grating;
tuning means for tuning the predetermined optical path length difference between the first and second optical paths of said interferometer to tune a wavelength of the first or second laser beam externally emerging from said second facet of said first or second semiconductor laser; and
control means for controlling a bias voltage of said first or second semiconductor laser to selectively set one of said first and second semiconductor lasers in a drive state.

23. A source according to claim 22, wherein said interferometer includes a Mach-Zehnder interferometer.

24. A source according to claim 23, wherein said Mach-Zehnder interferometer comprises:
a first half mirror for demultiplexing the first or second laser beam emerging from said first facet of said first or second semiconductor laser into the first and second optical paths;
a first total reflecting mirror for turning a laser beam from said first half mirror in a predetermined direction on the second optical path;
a second total reflecting mirror for turning the laser beam from said first total reflecting mirror toward the first optical path on the second optical path; and
a second half mirror for multiplexing the laser beam from said first half mirror and a laser beam from said second total reflecting mirror on the first optical path to output the interference light beam.

25. A source according to claim 24, wherein said Mach-Zehnder interferometer further comprises support means for commonly supporting said first and second total reflecting mirrors.

26. A source according to claim 25, wherein said tuning means includes drive means, connected to said support means, for moving said first and second total reflecting mirrors in a predetermined direction.

27. A source according to claim 23, wherein said Mach-Zehnder interferometer comprises:
a substrate on which an optical waveguide can be formed; and
first and second optical waveguides having a predetermined optical path length difference therebetween on said substrate and formed such that both end portions of said first and second optical waveguides are coupled with both end portions of the other of said first and second optical waveguides, respectively, said first optical waveguide being formed to have one end which receives the laser beam emerging from said first facet of said first or second semiconductor laser to demultiplex the laser beam into said second optical waveguide and the other end which multiplexes the laser beams from said first and second optical waveguides to cause the interference light beam to emerge.

28. A source according to claim 27, wherein said tuning means includes heater means for heating said second optical waveguide on said substrate to tune an optical path length of said second optical waveguide.

29. A source according to claim 28, wherein said first and second semiconductor lasers are formed on or coupled with said substrate.

30. A source according to claim 22, further comprising
first and second lens means for converting the first and second laser beams emerging from said first facets of said first and second semiconductor lasers into collimated beams to direct the collimated beams toward said interferometer.

31. A source according to claim 22, wherein said interferometer includes a Michelson interferometer.

32. A source according to claim 22, wherein said interferometer is arranged on an optical path in said external cavity to demultiplex the first or second laser beam emerging from said first facet of said first or second semiconductor laser into first and second optical paths having a predetermined optical path length difference therebetween, multiplex demultiplexed light components, output a first interference light beam having a transmittance maximized at a predetermined wavelength toward said diffraction grating, and output a second interference light beam having the transmittance minimized at a predetermined wavelength, thereby causing said interferometer to substantially serve as an optical filter for limiting wavelength bands of the first or second laser beams, and said interferometer being arranged such that a resolving power of the optical filter is higher than the predetermined resolving power of said diffraction grating; and said tunable wavelength light source, further comprising:

second control means for detecting the second interference light beam emerging from said interferometer to feed back the second interference light beam to said tuning means, thereby controlling the predetermined optical path length difference.

33. A source according to claim 32, wherein said second control means comprises:

a photoelectric converter for converting the second interference light beam emerging from said interferometer into an electrical signal;

an amplifier for amplifying the electrical signal converted by said photoelectric converter;

a comparator circuit for comparing the electrical signal amplified by said amplifier with a predetermined reference signal; and a control circuit for feeding back a control signal for controlling the predetermined optical path length difference to said tuning means on the basis of an output signal from said comparator circuit.

34. A source according to claim 33, wherein said interferometer includes a Mach-Zehnder interferometer.

35. A source according to claim 34, wherein said Mach-Zehnder interferometer comprises:

a first half mirror for demultiplexing the first or second laser beam emerging from said first facet of said first or second semiconductor laser into the first and second optical paths;

a first total reflecting mirror for turning a laser beam from said first half mirror in a predetermined direction on the second optical path;

a second total reflecting mirror for turning the laser beam from said first total reflecting mirror toward the first optical path on the second optical path; and a second half mirror for multiplexing the laser beam from said first half mirror and a laser beam from said second total reflecting mirror on the first optical path to output the first and second interference light beams.

36. A source according to claim 35, wherein said Mach-Zehnder interferometer further comprises support means for commonly supporting said first and second total reflecting mirrors.

37. A source according to claim 36, wherein said tuning means includes drive means, connected to said support means, for moving said first and second total reflecting mirrors in a predetermined direction.

38. A source according to claim 34, wherein said Mach-Zehnder interferometer comprises:

a substrate on which an optical waveguide can be formed; and first and second optical waveguides formed parallel to said substrate such that both end portions of said first and second optical waveguides are coupled with each other, respectively, said first optical waveguide having a predetermined optical path length difference with said second optical waveguide and being formed to have one end portion which receives the first or second laser beam emerging from said first facet of said first or second semiconductor laser to demodulate the laser beam into said second optical waveguide and another end portion which multiplexes the laser beams from said first and second optical waveguides to cause the first and second interference light beams to emerge.

39. A source according to claim 38, wherein said tuning means includes heater means for heating said second optical waveguide on said substrate to tune an optical path length of said second optical waveguide.

40. A source according to claim 38, wherein said first and second semiconductor lasers and at least part of said second control means are formed on said substrate.

41. A tunable wavelength light source, comprising:

a semiconductor laser having first and second opposing facets each of which emits a laser beam, said first facet being anti-reflection-coated;

a preselector arranged on an optical path of the laser beam emerging from said first facet, said preselector having a tunable wavelength filter for transmitting the laser beam emerging from said first facet of said semiconductor laser at a predetermined resolving power, and a total reflecting mirror for reflecting and returning only a light component having a specific wavelength transmitted by said tunable wavelength filter to said first facet of said semiconductor laser through said tunable wavelength filter again, and an external cavity between said second facet of said semiconductor laser and a reflecting surface of said total reflecting mirror;

an interferometer arranged on an optical path in said external cavity to demultiplex the laser beam emerging from said first facet of said semiconductor laser into first and second optical paths having a predetermined optical path length difference therebetween, multiplex demultiplexed light components, and output an interference light beam having a transmittance maximized at a predetermined wavelength toward said tunable wavelength filter of said preselector, thereby causing said interferometer to substantially serve as an optical filter for limiting a wavelength band of the laser beam, and interferometer being arranged such that a resolving power of the optical filter is higher than the predetermined resolving power of said tunable wavelength filter of said preselector; and tuning means for tuning the predetermined optical path length difference between the first and second optical paths of said interferometer to tune a wavelength of the laser beam externally emerging from said second facet of said semiconductor laser.

* * * * *